(12) United States Patent
Ikemoto et al.

(10) Patent No.: US 7,572,652 B2
(45) Date of Patent: Aug. 11, 2009

(54) LIGHT EMITTING ELEMENT AND PRODUCTION METHOD THEREOF

(75) Inventors: Yuhei Ikemoto, Aichi-ken (JP); Koji Hirata, Aichi-ken (JP); Kazuhiro Ito, Kyoto (JP); Yu Uchida, Kyoto (JP); Susumu Tsukimoto, Kyoto (JP); Masanori Murakami, Kyoto (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 168 days.

(21) Appl. No.: 11/708,683

(22) Filed: Feb. 21, 2007

(65) Prior Publication Data

US 2007/0210320 A1 Sep. 13, 2007

(30) Foreign Application Priority Data

Feb. 27, 2006 (JP) .............................. 2006-051163

(51) Int. Cl.
*H01L 21/00* (2006.01)
(52) U.S. Cl. ............................ 438/22; 438/46; 438/47; 257/13; 257/E33.001
(58) Field of Classification Search .................. 438/22, 438/46, 47; 257/13, 79, 86, 94, 99, 103, 257/E33.001
See application file for complete search history.

(56) References Cited

U.S. PATENT DOCUMENTS

| 4,743,750 | A | * | 5/1988 | Komatsu et al. ......... 250/214.1 |
| 2004/0173802 | A1 | * | 9/2004 | Yukimoto .................... 257/79 |
| 2004/0209390 | A1 | | 10/2004 | Senda et al. |
| 2008/0038857 | A1 | * | 2/2008 | Kim et al. ..................... 438/46 |

FOREIGN PATENT DOCUMENTS

JP 2004-269313 9/2004

OTHER PUBLICATIONS

Chinese Office Action dated Sep. 5, 2008, with English translation.

* cited by examiner

*Primary Examiner*—Evan Pert
*Assistant Examiner*—Scott R Wilson
(74) *Attorney, Agent, or Firm*—McGinn IP Law Group, PLLC

(57) ABSTRACT

A light emitting element having a light emitting element portion formed of a group III nitride-based compound semiconductor and having a layer to emit light. The light emitting element portion is formed by lifting off a substrate by wet etching after the light emitting element portion is grown on the substrate. The light emitting element portion has a lift-off surface that is kept substantially intact as it is formed in growing the light emitting element portion on the substrate.

15 Claims, 5 Drawing Sheets

FIG. 1
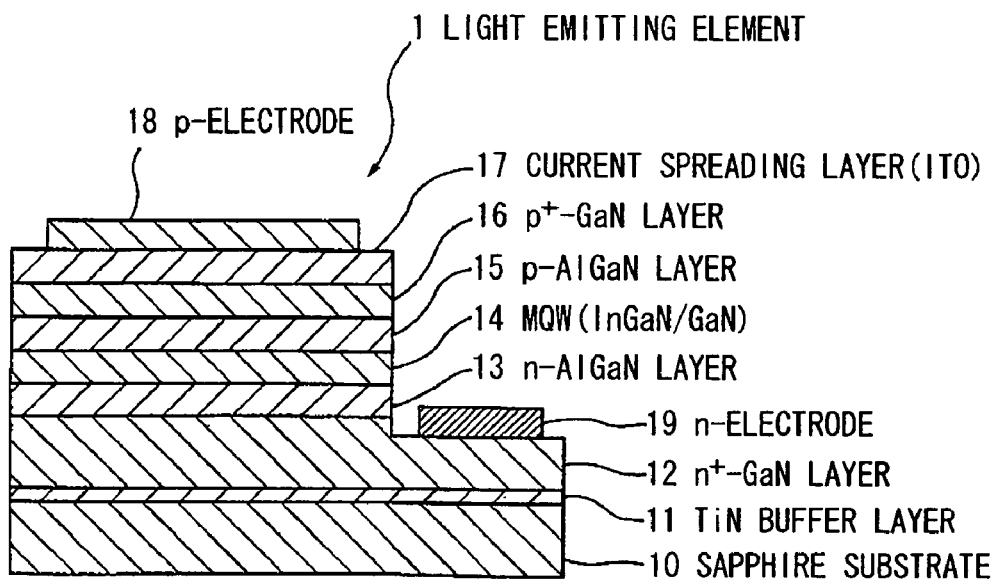
WET LIFT-OFF OF SUBSTRATE AND BUFFER LAYER
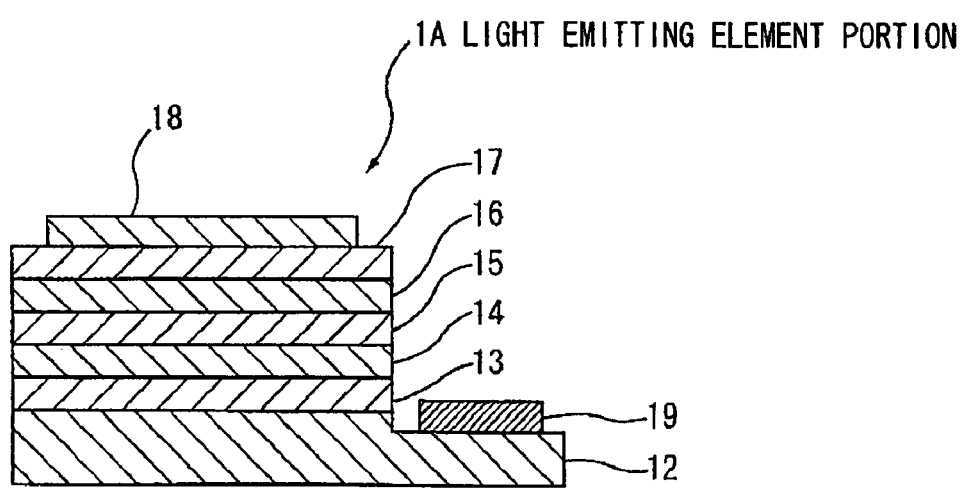

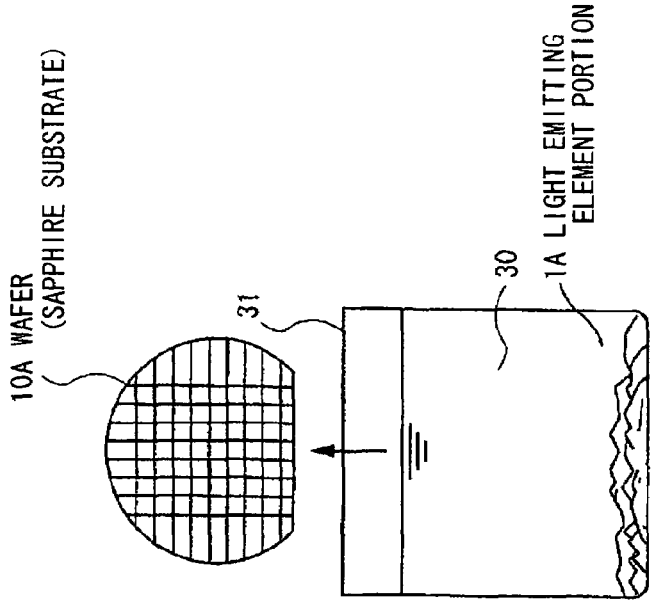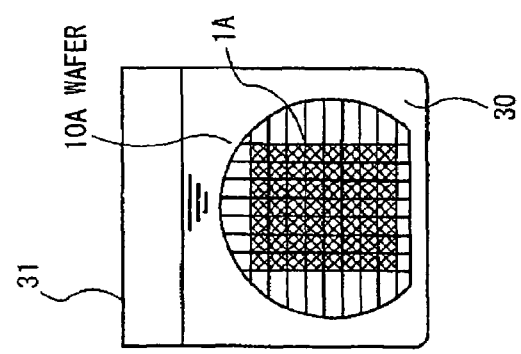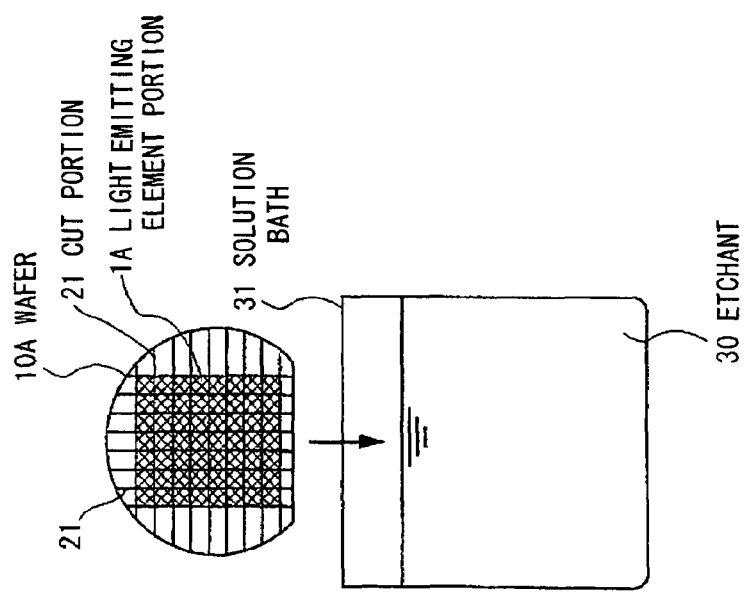

LIGHT EMITTING ELEMENT AND PRODUCTION METHOD THEREOF

The present application is based on Japanese patent application No. 2006-051163, the entire contents of which are incorporated herein by reference.

BACKGROUND OF THE INVENTION

1. Field of the Invention

This invention relates to a light emitting element formed of a group III nitride-based compound semiconductor and, in particular, to a group III nitride-based compound semiconductor light emitting element that is produced by lifting off a sapphire substrate, as a provisional substrate, to have an excellent flatness at the lift-off interface. Also, this invention relates to a method of making the light emitting element.

2. Description of the Related Art

A light emitting element formed of a group III nitride-based compound semiconductor, e.g., GaN is known. A substrate on which to grow the GaN is typically a sapphire substrate which is readily available and processable.

A GaN-based semiconductor layer is formed through a GaN or AlN buffer layer on the sapphire substrate to have a GaN-based light emitting element with a stable crystalline quality. Since the GaN-based light emitting element is adapted to emit a bluish light, it has been used often as a light source to generate white light. In connection with this use, the light emitting element is required to have higher light extraction efficiency.

A factor to determine the light extraction efficiency of the light emitting element is the refractive index of materials to compose the light emitting element. The GaN-based semiconductor layer has a refractive index n of about 2.4 and the sapphire substrate has a refractive index n of about 1.7. Depending on incidence angle of light emitted from inside of the light emitting element, total reflection may occur at the interface of the GaN and the sapphire substrate. Thereby, the reflected light may be absorbed in the light emitting element without being radiated outside to cause a light loss. A known solution to this problem is to lift off the sapphire substrate.

A lift-off method for the sapphire substrate is conducted such that, after a GaN film is grown on a sapphire substrate with a TiN film formed thereon, the sapphire substrate is separated from the GaN film by being heated in a microwave heating device to have a GaN crystal substrate (See JP-A-2004-269313).

However, the above method has a problem that, since the separation is performed by heating the interface of the GaN and the sapphire substrate, the GaN crystal obtained may be damaged near the interface by the heating separation to cause a reduction in light emitting efficiency.

Another lift-off method can be conducted such that the sapphire substrate is separated from the GaN film by irradiating selectively a laser light to the interface of the GaN and the sapphire substrate. However, the same problem applies to this method. Furthermore, in the sapphire lift-off method by the laser irradiation, the laser has to be scanned repeatedly. Thus, the number of steps thereof increases to lower the productivity.

SUMMARY OF THE INVENTION

It is an object of the invention to provide a light emitting element that has an excellent flatness, i.e., reduced damage, at the lift-off interface.

It is a further object of the invention to provide a method of making the light emitting element.

(1) According to one embodiment of the invention, a light emitting element comprises:

a light emitting element portion comprising a group III nitride-based compound semiconductor and including a layer to emit light, wherein the light emitting element portion is formed by lifting off a substrate by wet etching after the light emitting element portion is grown on the substrate, and the light emitting element portion further comprises a lift-off surface that is kept substantially intact as it is formed in growing the light emitting element portion on the substrate.

In the above invention (1), the following modifications and changes can be made.

(i) The lift-off surface comprises a flatness to prevent scattered reflection of the light emitted from the layer.

(2) According to another embodiment of the invention, a method of making a light emitting element comprises:

a first step of forming a buffer layer on a surface of a substrate;

a second step of forming a light emitting element portion on a surface of the buffer layer, the light emitting element portion comprising a semiconductor material and including a layer to emit light;

a third step of forming a cut portion to reach the substrate by grooving the light emitting element portion;

a fourth step of soaking the substrate in an etchant; and a fifth step of separating the light emitting element portion from the substrate by dissolving the buffer layer in the etchant; and a sixth step of collecting the separated light emitting element portion.

(3) According to another embodiment of the invention, a method of making a light emitting element comprises:

a first step of forming a TiN buffer layer on a surface of a substrate;

a second step of forming a light emitting element portion on a surface of the TiN buffer layer, the light emitting element portion comprising a semiconductor material and including a layer to emit light;

a third step of forming a cut portion to reach the substrate by grooving the light emitting element portion;

a fourth step of soaking the substrate in an etchant of nitric acids; and a fifth step of separating the light emitting element portion from the substrate by dissolving the TiN buffer layer in the etchant; and a sixth step of collecting the separated light emitting element portion.

(4) According to another embodiment of the invention, a method of making a light emitting element comprises:

a first step of forming a TiN buffer layer on a surface of a sapphire substrate;

a second step of forming a light emitting element portion on a surface of the TiN buffer layer, the light emitting element portion comprising a group III nitride-based compound semiconductor material and including a layer to emit light;

a third step of forming a cut portion to reach the sapphire substrate by grooving the light emitting element portion;

a fourth step of soaking the sapphire substrate in an etchant of nitric acids; and a fifth step of separating the light emitting element portion from the sapphire substrate by dissolving the TiN buffer layer in the etchant; and a sixth step of collecting the separated light emitting element portion.

In the above invention (2)-(4), the following modifications and changes can be made.

(ii) The second step includes to nitride the TiN buffer layer before forming the light emitting element portion.

(iii) The etchant of nitric acids comprises a mixture of nitric acid, glacial acetic acid and water.

(iv) The etchant of nitric acids comprises a mixture of nitric acid, glacial acetic acid and water mixed in a ratio of 1:1:1, respectively.

Advantages

A light emitting element can be provided that has an excellent flatness, i.e., reduced damage, at the lift-off interface.

In the above method, the TiN buffer layer is dissolved by the etchant of nitric acids to permeate the TiN buffer layer through the cut portion. Thus, the light emitting element portion can be readily separated from the sapphire substrate, which has a big difference in refractive index than the group III nitride-based compound semiconductor, while reducing damage to the light emitting element portion. In addition, the wafer light emitting element portion can be divided into the plural light emitting element portions concurrently with the separation.

BRIEF DESCRIPTION OF THE DRAWINGS

The preferred embodiments according to the invention will be explained below referring to the drawings, wherein:

FIG. 1 is a cross sectional view showing a group III nitride-based semiconductor light emitting element in a preferred embodiment according to the invention;

FIGS. 4A to 4C are illustrative diagrams showing a process (i.e., lift-off process by etching) of making the light emitting element of the embodiment.

DETAILED DESCRIPTION OF THE PREFERRED EMBODIMENTS

Figure 2A:
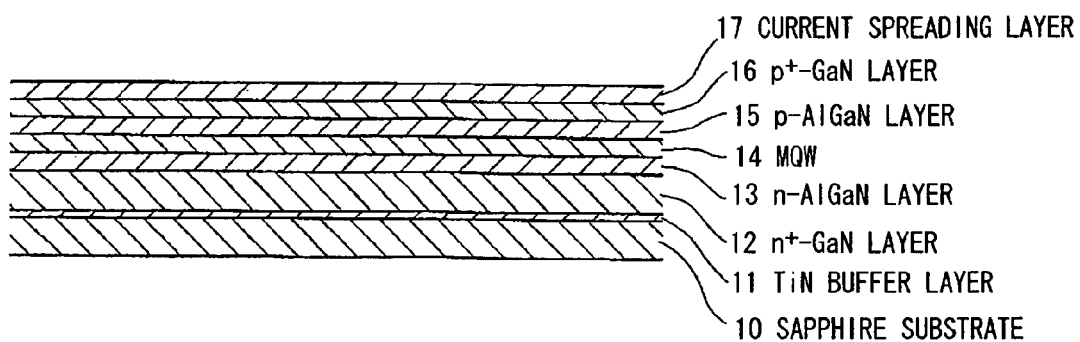
FIGS. 2A to 2C are cross sectional views showing a process (i.e., process until electrode formation) of making the light emitting element of the embodiment.

FIG. 1 is a cross sectional view showing a group III nitride-based compound semiconductor light emitting element (hereinafter also called simply "light emitting element") in the preferred embodiment according to the invention. Herein, "light emitting element portion" is used to define a light emitting element that a sapphire substrate and a TiN buffer layer is removed.

Composition of Light Emitting Element Portion

The light emitting element portion 1A is a horizontal type light emitting element portion that p-side and n-side electrodes thereof are disposed horizontally. The light emitting element portion 1A comprises: sequentially grown on a wafer sapphire substrate 10 as a growth substrate on which to grow the group III nitride-based compound semiconductor and a TiN buffer layer 11 formed on the sapphire substrate 10, a Si-doped $n^+$-GaN layer 12; a Si-doped n-AlGaN layer 13; an MQW (multiquantum well) 14 including an InGaN/GaN multiquantum well structure; an Mg-doped p-AlGaN layer 15; an Mg-doped $p^+$-GaN layer 16; and a current spreading layer 17 formed of ITO (indium tin oxide) to spread current into the $p^+$-GaN layer 16. The GaN-based semiconductor layers from the TiN buffer layer 11 to the $p^+$-GaN layer 16 are formed by MOCVD (metalorganic chemical vapor deposition). The sapphire substrate 10 is lifted off by soaking in an etchant of nitric acids to dissolve the TiN buffer layer.

The TiN buffer layer 11 is formed about 100 nm thick by sputtering a Ti target in an atmosphere of Ar and $N_2$. After forming the TiN buffer layer 11, the surface of the TiN buffer layer 11 is nitrided by retaining it at 1050° C. for 1 min. in an atmosphere of ammonia ($NH_3$) and $H_2$ in the MOCVD reactor. After the nitridation, internal temperature of the reactor is increased to 1150° C. to allow the growth of GaN.

The $n^+$-GaN layer 12 and the $p^+$-GaN layer 16 are formed by supplying $H_2$ carrier gas, $NH_3$ and TMG (trimethylgallium) into the reactor where the sapphire substrate 10 is disposed.

The $n^+$-GaN layer 12 is formed about 4 μm thick on the nitrided TiN buffer layer 11 while doping Si thereinto by using monosilane ($SiH_4$) as a Si source to provide the layer with n-type conductivity.

The $p^+$-GaN layer 16 is formed doped with Mg by using $Cp_2Mg$ (cyclopentadienyl magnesium) as an Mg source to provide the layer with p-type conductivity.

The MQW 14 is formed by supplying $N_2$ carrier gas, TMI (trimethylindium) and TMG into the reactor. The InGaN is formed by supplying TMI and TMG thereinto, and the GaN is formed by supplying TMG thereinto.

Figure 2B:
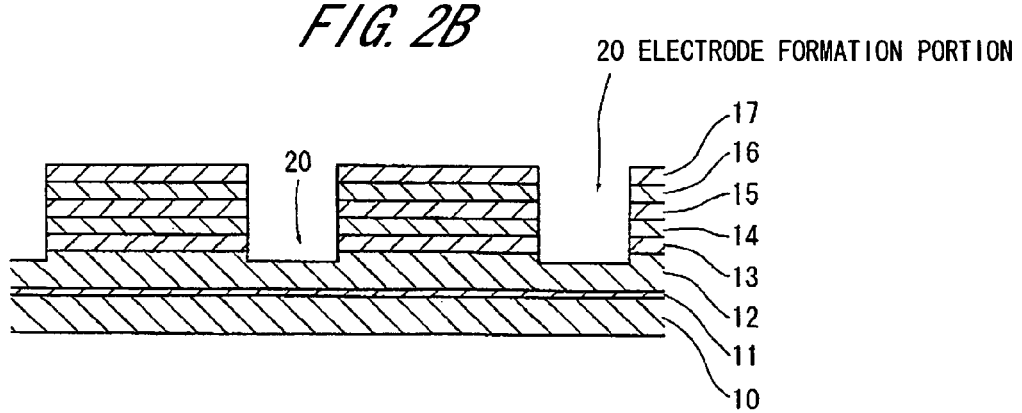
Figure 2C:
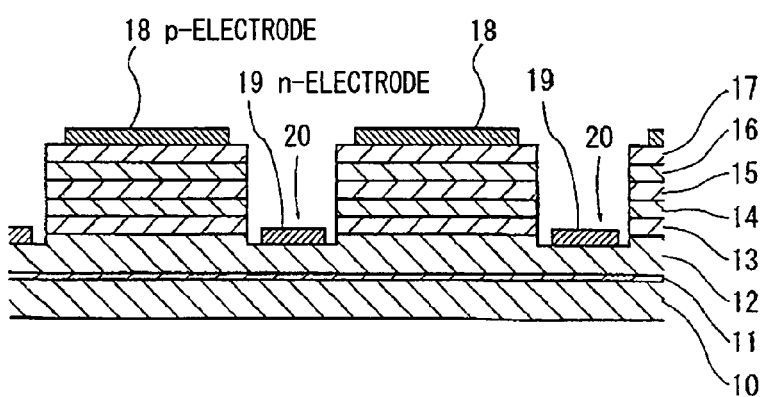

FIGS. 2A to 2C are cross sectional views showing a process (i.e., process until electrode formation) of making the light emitting element of the embodiment.

First, as shown in FIG. 2A, the GaN-based semiconductor layers from the TiN buffer layer 11 to the $p^+$-GaN layer 16 are grown on the wafer sapphire substrate 10 by MOCVD. The current spreading layer 17 is formed on the $p^+$-GaN layer 16 by sputtering.

Then, as shown in FIG. 2B, an electrode formation portion 20 is formed by partially removing a depth region from the current spreading layer 17 to the $n^+$-GaN layer 12 by dry etching.

Then, as shown in FIG. 2C, the p-side electrode of Au is formed on the surface of the current spreading layer 17 by deposition. Also, the n-side electrode 19 is formed on the $n^+$-GaN layer 12 exposed in the electrode formation portion 20.

Figure 3A:
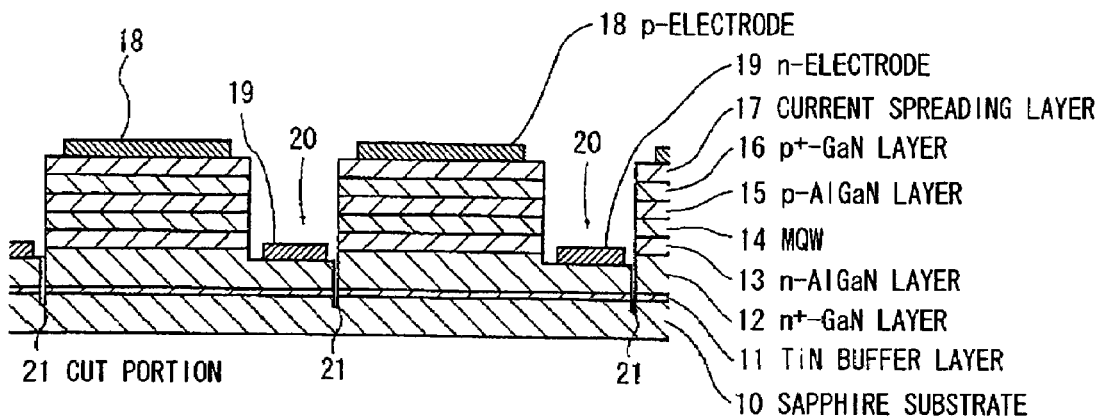
FIGS. 3A to 3C are cross sectional views showing a process (i.e., process until element separation) of making the light emitting element of the embodiment.
Figure 3B:
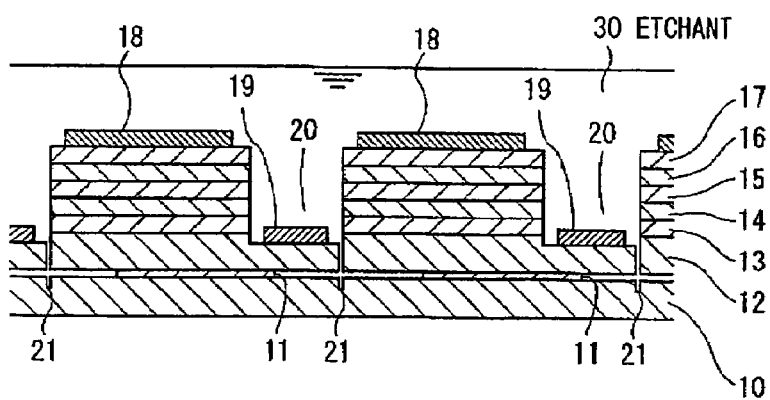
Figure 3C:
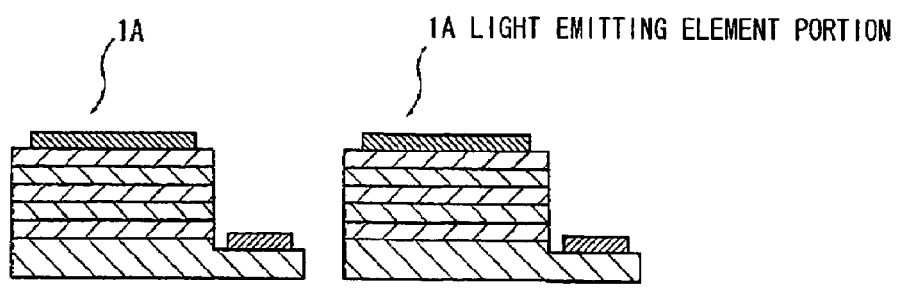

FIGS. 3A to 3C are cross sectional views showing a process (i.e., process until element separation) of making the light emitting element of the embodiment.

Then, as shown in FIG. 3A, a cut portion 21 is formed by grooving through half a thickness of the wafer sapphire substrate 10, on which the GaN-based semiconductor layers are formed, by using a dicing blade from the top side of the light emitting element.

Then, as shown in FIG. 3B, the wafer is soaked in an etchant 30 of nitric acids to dissolve the TiN buffer layer 11. In this embodiment, the etchant 30 is prepared by mixing nitric acid:glacial acetic acid: water=1:1:1. The etchant 30 serves to permeate the interface of the TiN buffer layer 11 and the sapphire substrate 10 as well as dissolving the TiN buffer layer 11 exposed in the cut portion 21.

FIG. 3C shows the light emitting element portions 1A after lifting off the sapphire substrate 10. The light emitting element portion 1A is formed separated from the sapphire substrate 10 by dissolving the TiN buffer layer 11.

FIGS. 4A to 4C are illustrative diagrams showing a process (i.e., lift-off process by etching) of making the light emitting element of the embodiment.

As shown in FIG. 4A, a wafer 10A has the plural light emitting element portions 1A grown through the TiN buffer layer 11 (not shown) on the sapphire substrate 10. The light emitting element portions 1A each have the current spreading layer 17, the p-side electrode 18 and the n-side electrode 19. The cut portions 21 are formed like a lattice on the wafer 10A to define a boundary between the light emitting element portions 1A.

As shown in FIG. 4B, the wafer 10A as shown in FIG. 4A is soaked in the etchant 30 filled in a solution bath 31. During the soaking, the TiN buffer layer 11 exposed in the cut portion 21 is etched, where the etchant 30 permeates the interface of the sapphire substrate 10 and the light emitting element portion 1A according as the TiN buffer layer 11 is dissolved.

FIG. 4C shows the light emitting element portions 1A after lifting off the sapphire substrate 10. As shown, after completing the etching, the light emitting element portions 1A are left in the etchant 30. Then, the wafer 10A with only the sapphire substrate 10 is taken out from the solution bath 31. Then, the light emitting element portions 1A are collected and cleaned. Then, the light emitting element portions 1A are each mounted on a mounting member by using a chip mounter.

Effects of the Embodiment

In this embodiment, the TiN buffer layer to be dissolved by the etchant of nitric acids is formed on the surface of the wafer sapphire substrate 10, the cut portions 21 are formed (or grooved) on the wafer 10A in accordance with the size of eth light emitting element portion 1A from the side of the GaN-based semiconductor layer, and the wafer 10A is soaked in the etchant of nitric acids to lift off the sapphire substrate 10. Thus, the plural light emitting element portions 1A formed on the wafer 10A can be efficiently lifted off from the sapphire substrate 10 by the wet etching.

The light emitting element portion 1A can prevent a reduction in light extraction efficiency caused by the interfacial reflection based on a refractive index difference between the sapphire substrate 10 and the GaN-based semiconductor layer (i.e., the lowermost GaN layer at the interface). Along with this, it can have a significantly reduced damage (i.e., excellent flatness) on the GaN interface as compared to that in case of lifting off the sapphire substrate by using the heating separation by the laser or microwave device.

In the method of dissolving the TiN buffer layer 11 by the etchant 30 of nitric acids, the surface of the $n^+$-GaN layer 12 exposed after removing the TiN buffer layer is kept intact without being roughened. Therefore, the light emitting element portion 1A can have an excellent flatness at an end face thereof, i.e., the surface of the $n^+$-GaN layer 12. Meanwhile, the $n^+$-GaN layer 12 can be doped with Si and therefore can be mounted on the mounting surface of a mounting member.

Figure 5:
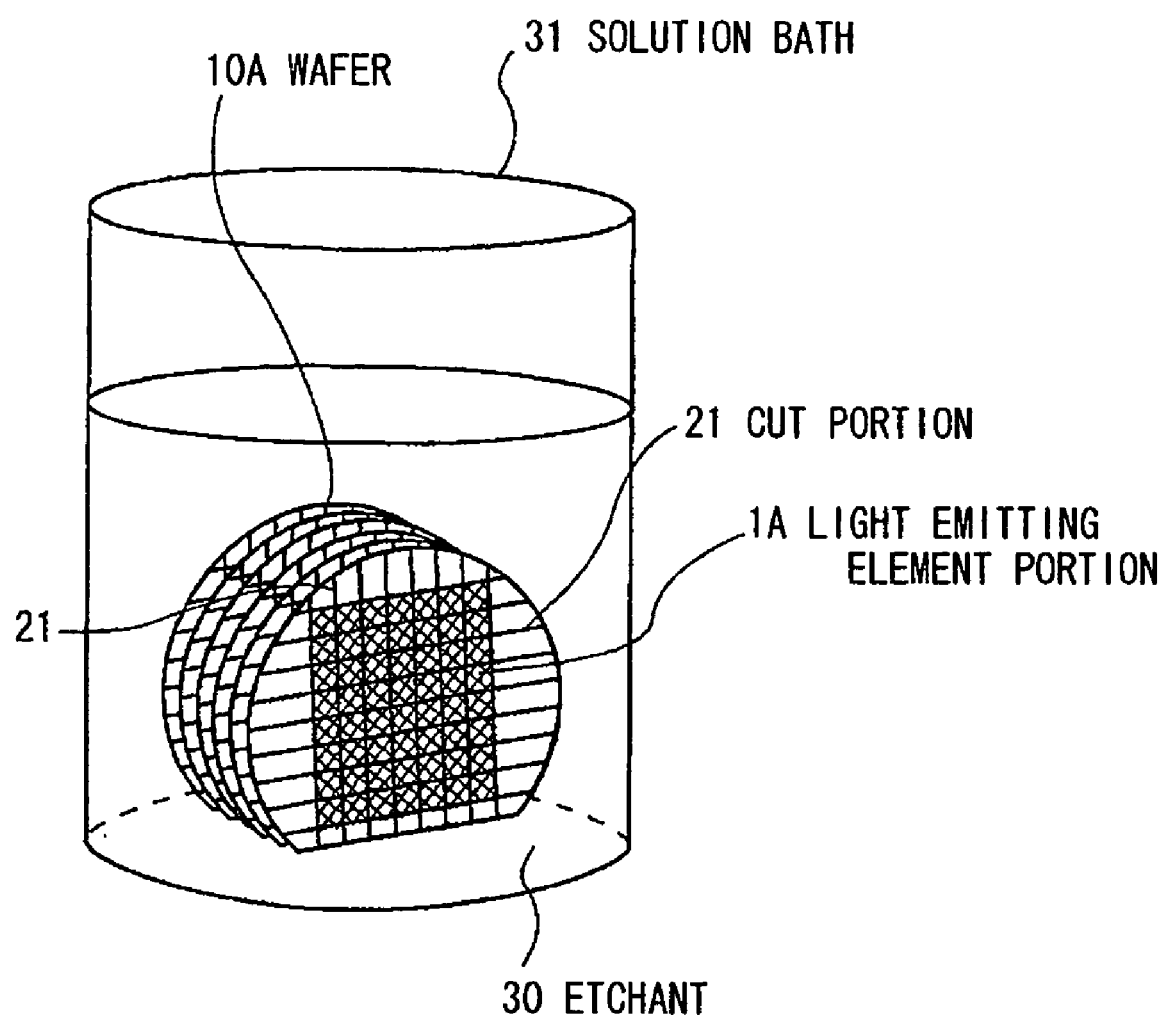
FIG. 5 is an illustrative diagram showing a batch process where plural wafers are soaked in an etchant.

Although in the above embodiment the one wafer is soaked in the etchant 30, plural wafers can be, as shown in FIG. 5, soaked in the etchant 30 to lift off the sapphire substrate 10 in a batch process.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a light emitting element, comprising:
    forming a buffer layer on a surface of a substrate;
    forming a light emitting element portion on a surface of the buffer layer, the light emitting element portion comprising a semiconductor material and including a layer to emit light;
    forming a cut portion to reach the substrate by grooving the light emitting element portion;
    soaking the substrate in an etchant; and
    separating the light emitting element portion from the substrate by dissolving the buffer layer in the etchant; and
    collecting the separated light emitting element portion.

2. The method according to claim 1, wherein the light emitting element portion further comprises:
    forming a $n^+$-GaN layer;
    forming a n-AlGaN layer formed on the $n^+$-GaN layer;
    forming a multiquantum well (MQW), including an InGaN/GaN multiquantum well structure formed on the n-AlGaN layer;
    forming a p-AlGaN layer formed on the multiquantum well;
    forming a $p^+$-GaN layer formed on the p-AlGaN layer; and
    forming a current spreading layer, formed of indium tin oxide (ITO) to spread current into the $p^+$-GaN layer.

3. The method according to claim 2, wherein an electrode is formed on the $n^+$-GaN layer.

4. The method according to claim 2, further comprising: after separating the light emitting element portion, doping the $n^+$-GaN layer with Si.

5. The method according to claim 2, further comprising: doping the $p^+$-GaN layer with Mg.

6. The method according to claim 1, wherein said forming said light emitting element portion comprises using metalorganic chemical vapor deposition (MOCVD).

7. The method according to claim 1, further comprising: forming an electrode on the current spreading layer.

8. A method of making a light emitting element, comprising:
    forming a TiN buffer layer on a surface of a substrate;
    forming a light emitting element portion on a surface of the TiN buffer layer, the light emitting element portion comprising a semiconductor material and including a layer to emit light;
    forming a cut portion to reach the substrate by grooving the light emitting element portion;
    soaking the substrate in an etchant of nitric acids; and
    separating the light emitting element portion from the substrate by dissolving the TiN buffer layer in the etchant; and
    collecting the separated light emitting element portion.

9. The method according to claim 8, wherein:
    the forming a light emitting element portion includes to nitride the TiN buffer layer before forming the light emitting element portion.

10. The method according to claim 8, wherein:
    the etchant of nitric acids comprises a mixture of nitric acid, glacial acetic acid and water.

11. The method according to claim 8, wherein:
    the etchant of nitric acids comprises a mixture of nitric acid, glacial acetic acid and water mixed in a ratio of 1:1:1, respectively.

12. A method of making a light emitting element, comprising:
    forming a TiN buffer layer on a surface of a sapphire substrate;
    forming a light emitting element portion on a surface of the TiN buffer layer, the light emitting element portion comprising a group III nitride-based compound semiconductor material and including a layer to emit light;
    forming a cut portion to reach the sapphire substrate by grooving the light emitting element portion.;
    soaking the sapphire substrate in an etchant of nitric acids; and separating the light emitting element portion from the sapphire substrate by dissolving the TiN buffer layer in the etchant; and collecting the separated light emitting element portion.

13. The method according to claim 12, wherein:

the forming a light emittting element portion includes nitriding the TiN buffer layer before forming the light emitting element portion.

14. The method according to claim 12, wherein:

the etchant of nitric acids comprises a mixture of nitric acid, glacial acetic acid and water.

15. The method according to claim 12, wherein:

the etchant of nitric acids comprises a mixture of nitric acid, glacial acetic acid and water mixed in a ratio of 1:1:1, respectively.

* * * * *